United States Patent
Baek et al.

(10) Patent No.: US 8,143,693 B2
(45) Date of Patent: Mar. 27, 2012

(54) SEMICONDUCTOR DEVICE INCLUDING REDISTRIBUTION LINE STRUCTURE AND METHOD OF FABRICATING THE SAME

(75) Inventors: Seung-Duk Baek, Gyeonggi-do (KR); Sun-Won Kang, Seoul (KR); Hyun-Soo Chung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 558 days.

(21) Appl. No.: 12/098,352

(22) Filed: Apr. 4, 2008

(65) Prior Publication Data
US 2008/0246113 A1    Oct. 9, 2008

(30) Foreign Application Priority Data
Apr. 4, 2007    (KR) .................. 10-2007-0033394

(51) Int. Cl.
*H01L 29/00*    (2006.01)

(52) U.S. Cl. ........ 257/529; 257/701; 257/702; 257/774; 257/E21.135; 257/E23.021; 438/612

(58) Field of Classification Search .................. 257/529, 257/E21.135, 701, 702, 531, 774, 738, E23.021; 438/612
See application file for complete search history.

(56) References Cited

U.S. PATENT DOCUMENTS

2005/0242418 A1    11/2005    Yang
2007/0132108 A1*   6/2007    Lee et al. .................. 257/780

FOREIGN PATENT DOCUMENTS

| JP | 2004-207268 | 7/2004 |
| JP | 2005-093931 | 4/2005 |
| JP | 2006-173436 | 6/2006 |
| JP | 2006-173476 | 6/2006 |
| KR | 2001-0045280 | 6/2001 |
| KR | 10-2005-0059618 | 6/2005 |
| KR | 10-2006-0058954 | 6/2006 |

OTHER PUBLICATIONS

English language abstract of Korean Publication No. 2001-0045280.
English language abstract of Japanese Publication No. 2004-207268.

* cited by examiner

*Primary Examiner* — Cuong Q Nguyen
*Assistant Examiner* — Cathy N Lam
(74) *Attorney, Agent, or Firm* — Myers Bigel Sibley & Sajovec, P.A.

(57) ABSTRACT

The invention provides a semiconductor device. The semiconductor device includes a semiconductor chip having an active surface on which pads are disposed, a passivation layer pattern disposed to cover the active surface of the semiconductor chip and to expose the pads, a first insulation layer pattern disposed on the passivation layer pattern, a second insulation layer pattern disposed on only a portion of the first insulation layer pattern, and redistribution line patterns electrically connected to the pads and disposed so as to extend across the second insulation layer pattern and the first insulation layer pattern. A method of fabricating the same is also provided.

22 Claims, 5 Drawing Sheets

SEMICONDUCTOR DEVICE INCLUDING REDISTRIBUTION LINE STRUCTURE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2007-0033394 filed on Apr. 4, 2007, the entire contents of which are hereby incorporated by reference.

BACKGROUND

1. Technical Field

The present invention relates to a semiconductor device and method of forming the same. More particularly, the present invention relates to semiconductor devices including redistribution line structures and methods of fabricating the same.

2. Description of the Related Art

In the semiconductor field, a major focus of technology research is to minimize the size of a semiconductor device. Also in the semiconductor device packaging field, consumer demand for small-size computers and portable electronic devices is increasing significantly. Semiconductor device packages which provide a high pin count in a small size, including a Fine Pitch Ball Grid Array (FBGA) package and a Chip Scale Package (CSP), are being developed.

The semiconductor device packages, for example, the FBGA package and the CSP, have a physical advantage in that they are small in size and light in weight. However, they do not have equivalent quality and reliability as compared with a conventional plastic package. Further, the cost of raw materials and the cost of the processing required for production of these packages are relatively high at this point in development. A Micro-ball Grid Array (micro BGA; µBGA) package, which is a typical example of recent chip scale package designs, has better characteristics than the FBGA package or the CSP. However, it also lags behind the conventional plastic package in reliability and cost.

In order to overcome these disadvantages, a Wafer Level Chip Scale Package (wafer level CSP; WL-CSP) has been developed. The WL-CSP uses redistribution or rerouting of bonding pads of a semiconductor chip to provide packaging flexibility.

In a semiconductor device fabrication (FAB) process, the WL-CSP redistributes another pad, larger in size, in place of the bonding pad on the semiconductor chip. Then, an external connection terminal, for example, a solder ball or a bonding wire, is formed on the redistributed pad.

FIG. 1 and FIG. 2 are cross-sectional views of semiconductor devices including conventional redistribution line structures.

Referring to FIG. 1, a semiconductor device may include a semiconductor chip 10, a passivation layer pattern 14, a first insulation layer pattern 16, a redistribution line pattern 20, and a second insulation layer pattern 22.

The semiconductor chip 10 includes an active surface on which a bonding pad 12 is disposed. The passivation layer pattern 14 covers the active surface of the semiconductor chip 10 and exposes a portion of a surface of the bonding pad 12. The first insulation layer pattern 16 is disposed on the entire surface of the passivation layer pattern 14. The redistribution line pattern 20 is extended on the first insulation layer pattern 16 while being electrically connected to the exposed portion of the surface of the bonding pad 12. The second insulation layer pattern 22 includes a land opening 23 exposing another portion of a surface of the redistribution line pattern 20 which is spaced apart from the bonding pad 12.

An Under Barrier Metal (UBM) pattern (not shown) is interposed on the exposed portion of the surface of the bonding pad 12, the bonding pad 12 which overlaps the redistribution line pattern 20, and on the first insulation layer pattern 16. The redistribution line pattern 20 is electrically connected to an external circuit through a connection means (not shown), for example, a solder ball or a bonding wire provided in the land opening 23.

The passivation layer pattern 14 alone is insufficient to protect the semiconductor chip 10 from various stresses or damage inflicted by the external environment during a redistribution process or other package assembly processes. Therefore, the first insulation layer pattern 16 is further provided on the passivation layer pattern 14 in order to protect the semiconductor chip 10 from stresses inflicted from the external environment.

Referring to FIG. 2, a semiconductor device includes a semiconductor chip 110, a passivation layer pattern 114, a first insulation layer pattern 116, a second insulation layer pattern 118, a redistribution line pattern 120, and a third insulation layer pattern 122.

The semiconductor chip 110 includes an active surface on which a bonding pad 112 is disposed. The passivation layer pattern 114 covers the active surface of the semiconductor chip 110 and exposes a portion of a surface of the bonding pad 112. The first insulation layer pattern 116 is disposed on the passivation layer pattern 114. The first insulation layer pattern 116 has a fuse cutting opening 117. The fuse cutting opening 117 exposes the passivation layer pattern 114 over a fuse 111 included within the semiconductor chip 110. The second insulation layer pattern 118 is disposed on the entire surface of the first insulation layer pattern 116, while filling the fuse cutting opening 117. The redistribution line pattern 120 is extended on the second insulation layer pattern 118, while being electrically connected to the exposed portion of the surface of the bonding pad 112. The third insulation layer pattern 122 has a land opening 123 exposing another portion of a surface of the redistribution line pattern 120 which is spaced apart from the bonding pad 112.

An Under Barrier Metal (UBM) pattern (not shown) is interposed on the exposed portion of the surface of the bonding pad 112 overlapping with the redistribution line pattern 120 and on the second insulation layer pattern 118. The redistribution line pattern 120 is connected to an external circuit through a connection means (not shown), for example, a solder ball or a bonding wire provided in the land opening 123.

As described with reference to FIG. 1, the first insulation layer pattern 116 is further provided on the passivation layer pattern 114 in order to protect the semiconductor chip 110 from various stresses inflicted from the external environment during a redistribution process for fabricating a Wafer Level Chip Scale Package (wafer level CSP; WL-CSP).

The fuse 111 may be provided to repair the semiconductor chip 110 if the semiconductor chip 110 is identified as defective during a testing process. Generally, the redistribution process is performed after defective semiconductor chips 110 are repaired. If the second insulation layer pattern 118 is not disposed between the first insulation layer pattern 116 and the redistribution line pattern 120, a defect may occur in the semiconductor chip 110 having the fuse cutting opening 117 during an etching process for fabricating the UBM pattern, which is one of the processes of fabricating the redistribution line pattern 120. Also, during a plating process for forming the redistribution line pattern 120, an Electrical Die Sorting (EDS) bonding pad (not shown) may be inadvertently electrically connected with the redistribution line pattern 120. Accordingly, a process for forming the second insulation layer pattern 118 is required, before performing a process for forming the redistribution line pattern 120.

In the semiconductor devices including redistribution line structures as described above, a multilayer of insulation layer patterns is formed on a wafer. Therefore, the warpage of the wafer where semiconductor chips are formed may increase as a result of differences in the Coefficient of Thermal Expansion (CTE) between the wafer and the multilayer of insulation layer patterns. Such warpage of the wafer not only makes it difficult to perform redistribution and subsequent processes, but also causes the reliability of the semiconductor device to decrease, resulting from stress inflicted on semiconductor chips. The present invention addresses these and other disadvantages of the conventional art.

SUMMARY

Exemplary embodiments of the present invention are related to a semiconductor device and a method of fabricating the same. In an exemplary embodiment, the semiconductor device may include a semiconductor chip having an active surface on which pads are disposed; a passivation layer pattern covering the active surface of the semiconductor chip and exposing the pads; a first insulation layer pattern on the passivation layer pattern; a second insulation layer pattern disposed on only a portion of the first insulation layer pattern; and redistribution line patterns electrically connected to the pads and disposed so as to extend across the second insulation layer pattern and the first insulation layer pattern, wherein the second insulation layer pattern is disposed so as to cover approximately half or less of a total surface of the semiconductor chip.

DETAILED DESCRIPTION

Figure 1:
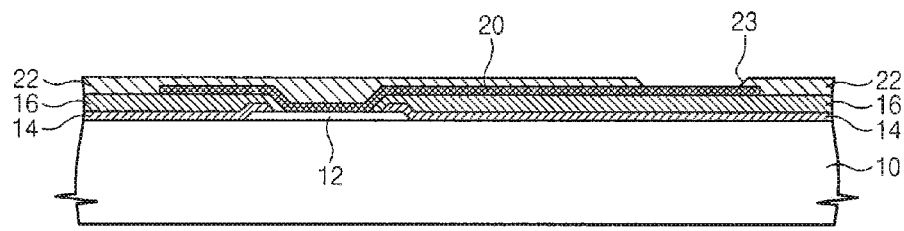
FIG. 1 and FIG. 2 are cross-sectional views of semiconductor devices including conventional redistribution line structures.
Figure 2:
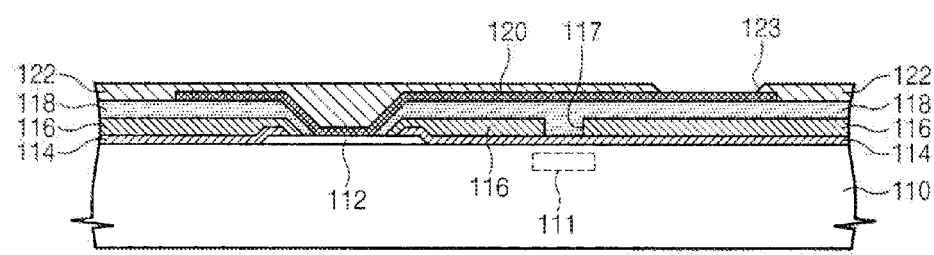

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

FIGS. 3 to 7 are cross-sectional views of a semiconductor device including redistribution line structures according to exemplary embodiments of the present invention.

Figure 3:
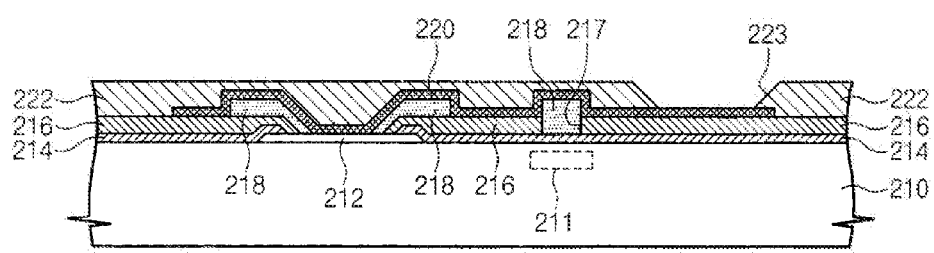
FIGS. 3 to 7 are cross-sectional views of semiconductor devices including redistribution line structures according to exemplary embodiments of the present invention.

Referring to FIG. 3, a semiconductor device may include a semiconductor chip 210, a passivation layer pattern 214, a first insulation layer pattern 216, a second insulation layer pattern 218, a redistribution layer pattern 220, and a third insulation layer pattern 222.

The semiconductor chip 210 may include an active surface on which a bonding pad 212 is disposed. The passivation layer pattern 214 may cover the active surface of the semiconductor chip 210 and expose a portion of a surface of the bonding pad 212. The first insulation layer pattern 216 may be disposed on the passivation layer pattern 214. The first insulation layer pattern 216 may have a fuse cutting opening 217, the fuse cutting opening 217 exposing the passivation layer pattern 214 over a fuse 211 included within the semiconductor chip 210. The second insulation layer pattern 218 may be disposed on a portion of a surface of the first insulation layer pattern 216, while filling the fuse cutting opening 217. The redistribution line pattern 220 may be extended on the second insulation layer pattern 218, while being electrically connected to the exposed portion of the surface of the bonding pad 212. The third insulation layer pattern 222 may have a land opening 223 exposing a portion of a surface of the redistribution line pattern 220 which is spaced apart from the bonding pad 212. The second insulation layer pattern 218 may be formed so as to take up an area equal to approximately half or less of a total area of the semiconductor chip 210.

An Under Barrier Metal (UBM) pattern (not shown) may be interposed on the exposed portion of the surface of the bonding pad 212 overlapping with the redistribution line pattern 220, on the first insulation layer pattern 216, and on the second insulation layer pattern 218. The UBM pattern may be used as an electrode during a plating process for forming the redistribution line pattern 220.

The redistribution line pattern 220 may be electrically connected to an external circuit through a connection means (not shown), for example, a solder ball or a bonding wire, provided in the land opening 223.

The first insulation layer pattern 216 may be disposed on the passivation layer pattern 214 in order to protect the semiconductor chip 210 from various stresses inflicted from the external environment during a redistribution process for fabricating a Wafer Level Chip Scale Package (wafer level CSP; WL-CSP) or during other package assembly processes.

The fuse 211 may be provided to repair the semiconductor chip 210 when the semiconductor chip 210 is identified as defective in a testing process. Generally, the redistribution process is performed after defective semiconductor chips 210 are repaired. If the second insulation layer pattern 218 is not disposed between the first insulation layer pattern 216 and the redistribution line pattern 220, a defect may occur in the semiconductor chip 210 having the fuse cutting opening 217 during an etching process for fabricating the UBM pattern, which is one of the processes of fabricating the redistribution line pattern 220. Also, during the plating process for forming the redistribution line pattern 220, an Electrical Die Sorting (EDS) bonding pad (not shown) may be inadvertently electrically connected with the redistribution line pattern 220. Accordingly, a process for forming the second insulation layer pattern 218 should be performed before performing a process for forming the redistribution line pattern 216.

In the semiconductor device including a redistribution line structure described above, a second insulation layer pattern, unlike in the conventional art, is disposed only on a portion of the surface of the semiconductor device. For example, the second insulation layer pattern 218 is formed on the first insulation layer pattern 216 close to the bonding pad 212, in the fuse cutting opening 217, and on a bonding pad used in an EDS process. Therefore, the warpage of a wafer may be minimized because the warpage is caused by differences in the Coefficient of Thermal Expansion (CTE) between the wafer and a multilayer of insulation layer patterns. Consequently, it is not only easy to perform redistribution and subsequent processes, but also stress inflicted on semiconductor chips by the warpage of the wafer is minimized so as to enhance the reliability of the semiconductor device.

Figure 4:
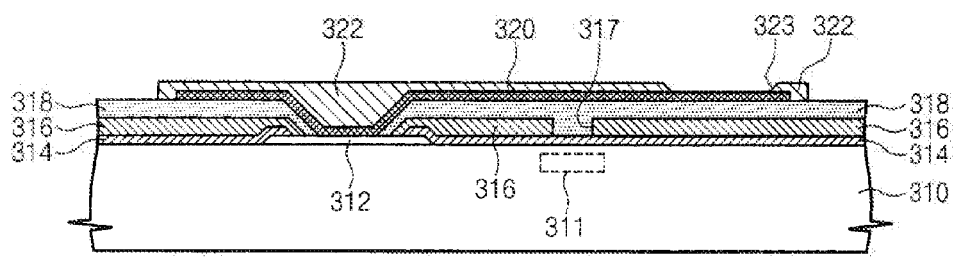

Referring to FIG. 4, a second insulation layer pattern 318 of a semiconductor device according to an exemplary embodiment of the present invention, unlike the embodiment of FIG. 3, may be disposed on the entire surface of a first insulation layer pattern 316, while filling a fuse cutting opening 317. Also, a third insulation layer pattern 322 may have a land opening 323 exposing a portion of a surface of a redistribution line pattern 320 which is spaced apart from a bonding pad 312. The third insulation layer pattern 322 may be formed so as to cover approximately half or less of a total area of a semiconductor chip 310.

An Under Barrier Metal (UBM) pattern (not shown) may be interposed on an exposed portion of a surface of the bonding pad 312 overlapping with the redistribution line pattern 320 and on the second insulation layer pattern 318. The UBM pattern may be used as an electrode during a plating process for forming the redistribution line pattern 320.

In the semiconductor device including a redistribution line structure described above, a third insulation layer pattern, unlike the conventional art, is disposed so as to only cover a redistribution line pattern. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

Figure 5:
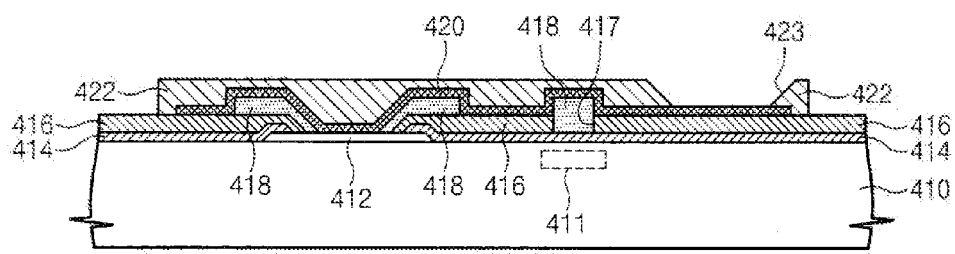

Referring to FIG. 5, a third insulation layer pattern 422 of a semiconductor device according to an exemplary embodiment of the present invention, unlike the embodiment of FIG. 3, may have a land opening 423 exposing a portion of a surface of a redistribution line pattern 420 which is spaced apart from a bonding pad 412, while only covering the redistribution line pattern 420. A second insulation layer pattern 418, unlike the embodiment of FIG. 4, may be disposed only on a portion of a first insulation layer pattern 416 and fill the fuse cutting opening 417. The second insulation layer pattern 418 and the third insulation layer pattern 422 may be formed so as to cover approximately half or less of a total area of a semiconductor chip 410, respectively.

An Under Barrier Metal (UBM) pattern (not shown) may be interposed on an exposed portion of a surface of the bonding pad 412 overlapping with the redistribution line pattern 420 and on the second insulation layer pattern 418. The UBM pattern may be used as an electrode during a plating process for forming the redistribution line pattern 320.

Unlike the conventional art, in the semiconductor device including a redistribution line structure described above, a second insulation layer pattern is disposed on only certain portions of the surface of the semiconductor device. For example, the second insulation layer may be formed on a first insulation layer pattern close to a bonding pad, on a fuse cutting opening, and on a bonding pad used in an Electrical Die Sorting (EDS) process. Also, a third insulation layer pattern is disposed to cover only a redistribution line pattern. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

Figure 6:
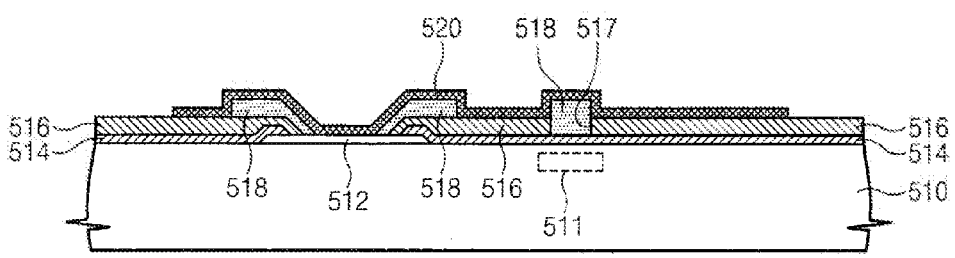

Referring to FIG. 6, unlike the embodiment of FIG. 3, a semiconductor device according to an exemplary embodiment may not include a third insulation layer pattern (222 of FIG. 3) having a land opening (223 of FIG. 3) exposing a portion of a surface of a redistribution line pattern 520 which is spaced apart from a bonding pad 512. The third insulation layer pattern may be replaced by a molding material or an adhesive material used in a subsequent process, for example, a molding process which is to cover a semiconductor chip 510 with the molding material or a stacking process of semiconductor chips 510 using the adhesive material. A second insulation layer pattern 522 may be formed so as to cover approximately half or less of a total area of a semiconductor chip 510.

An Under Barrier Metal (UBM) pattern (not shown) may be interposed on an exposed portion of a surface of the bonding pad 512 overlapping with the redistribution line pattern 520, on a first insulation layer pattern 516 and on a second insulation layer pattern 518. The UBM pattern may be used as an electrode during a plating process for forming the redistribution line pattern 520.

The redistribution layer pattern 520 may be electrically connected to an external circuit through a connecting means, for example, a solder ball or a bonding wire provided on a predetermined surface of the redistribution line pattern 520.

Unlike the conventional art, in the semiconductor device including a redistribution line structure described above, a second insulation layer pattern is disposed on only certain portions of the surface of the semiconductor device. For example, the second insulation layer pattern may be formed on a first insulation layer pattern close to a bonding pad, on a fuse cutting opening, and on a bonding pad used in an Electrical Die Sorting (EDS) process. Also, a third insulation layer pattern is not included in the semiconductor device. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

Figure 7:
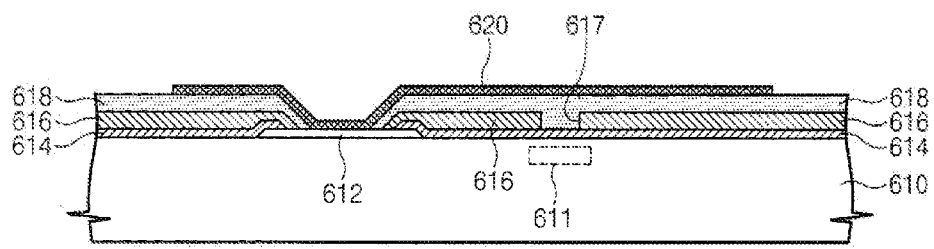

Referring to FIG. 7, unlike the embodiment of FIG. 4, a semiconductor device according to this exemplary embodiment may not include a third insulation layer pattern (322 of FIG. 4) having a land opening (323 of FIG. 4) exposing a portion of a surface of a redistribution line pattern 620 which is spaced apart from a bonding pad 612. The third insulation layer pattern may be replaced by a molding material or an adhesive material used in a subsequent process, for example, a molding process which is to cover a semiconductor chip 610 with the molding material or a stacking process of semiconductor chips 610 using the adhesive material.

An Under Barrier Metal (UBM) pattern (not shown) may be interposed on an exposed portion of a surface of the bonding pad 612 overlapping with the redistribution line pattern 620, on a first insulation layer pattern 616 and on a second insulation layer pattern 618. The UBM pattern may be used as an electrode during a plating process for forming the redistribution line pattern 620.

The redistribution layer pattern 620 may be electrically connected to an external circuit through a connecting means, for example, a solder ball or a bonding wire provided on a predetermined surface of the redistribution line pattern 620.

Unlike the conventional art, in the semiconductor device including a redistribution line structure described above, the semiconductor device does not include a third insulation layer pattern. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

FIGS. 8A to 8D are cross-sectional views illustrating a method of forming a semiconductor device including a redistribution line structure according to an exemplary embodiment of the present invention.

Figure 8A:
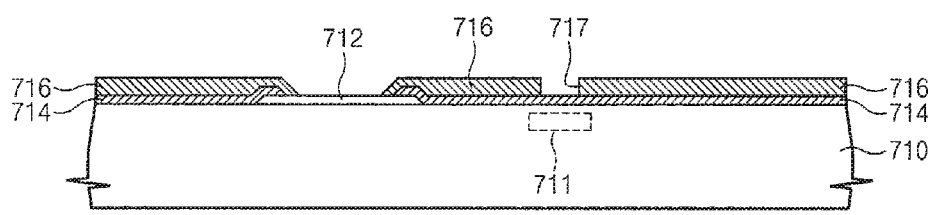
FIGS. 8A to 8D are cross-sectional views illustrating a method of fabricating a semiconductor device including a redistribution line structure according to an exemplary embodiment of the present invention.

Referring to FIG. 8A, a semiconductor chip 710 is provided, the semiconductor chip 710 including an active surface on which bonding pads 712 are disposed. The semiconductor chip 710 may include a repairing fuse 711, provided for use when a defect is found in an Electrical Die Sorting (EDS) process. Semiconductor chips 710 may be formed on a wafer. A process for fabricating a redistribution line structure may be for the semiconductor chips 710 formed on the entire surface of the wafer. In other words, the process for fabricating a redistribution line structure may be a wafer-level process.

A passivation layer pattern 714 may be formed, the passivation layer pattern 714 covering the active surface of the semiconductor chip 710 and exposing the bonding pads 712. The passivation layer pattern 714 may include an inorganic substance, for example, silicon oxide ($SiO_2$), silicon nitride (SiN), and silicon oxynitride (SiON).

A first insulation layer pattern 716 may be formed on the passivation layer pattern 714. The first insulation layer pattern 716 may include a fuse cutting opening 717 exposing the passivation layer pattern 714 over the fuse 711 included within the semiconductor chip 710. The first insulation layer pattern 716 may be made of an insulation layer of polymer-based material. The polymer-based material may include at least one selected from epoxy, polyimide, benzocyclobutene (BCB), or polybenzoxazole (PBO). The fuse cutting opening 717 may be for repairing the semiconductor chip 710 when the semiconductor chip 710 is identified as defective in the EDS process.

Figure 8B:
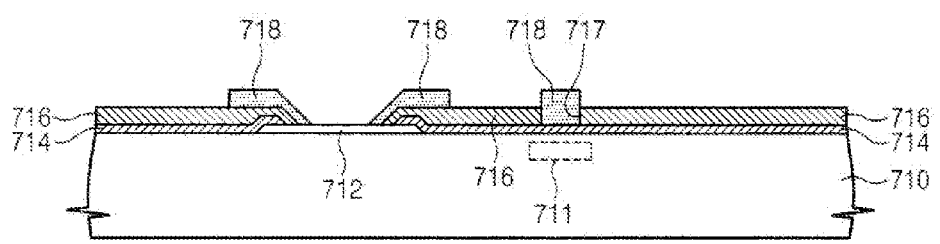

Referring to FIG. 8B, a second insulation layer pattern 718 may be formed on the first insulation layer pattern 716. The second insulation layer pattern 718 may be formed so that it fills the fuse cutting opening 717. The second insulation layer pattern 718 may be made of an insulation layer of polymer-based material. The polymer-based material may include at least one selected from epoxy, polyimide, BCB, or PBO.

The second insulation layer pattern 718 may be disposed only on certain portions of the surface of the semiconductor device. For example, the second insulation layer pattern 718 may be formed on the first insulation layer pattern 716, on the fuse cutting opening 717, and on a bonding pad (not shown) used in the ESD process. The second insulation layer pattern 718 may be formed so as to cover approximately half of a total area of the semiconductor chip 710.

Forming the second insulation layer pattern 718 on the first insulation layer pattern 716 disposed close to the bonding pads 712 is to provide for the case when the active surface close to the bonding pads 712 is exposed due to misalignment, during a process of forming the passivation layer pattern 714 and/or the first insulation layer pattern 716. Accordingly, damage inflicted on the semiconductor chip 710 may be minimized.

Figure 8C:
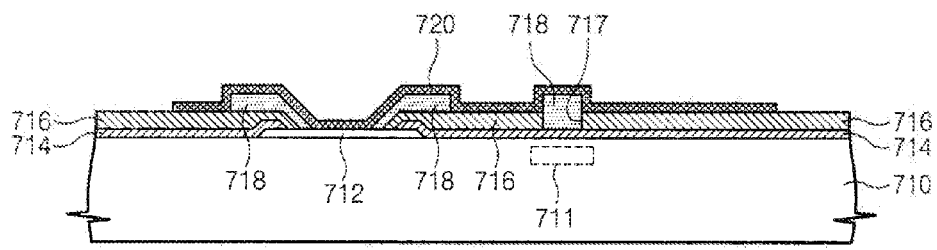

Referring to FIG. 8C, redistribution line patterns 720 may be formed, the redistribution line patterns 720 extending on the second insulation layer pattern 718, while being electrically connected to the bonding pads 712. An Under Barrier Metal (UBM) pattern (not shown) may be interposed on the exposed portions of the surfaces of the bonding pads 712 which overlap with the redistribution line patterns 720, on the second insulation layer pattern 718, and on the first insulation layer pattern 716. The UBM pattern may be used as an electrode in a plating process for forming the redistribution line patterns 720.

Figure 8D:
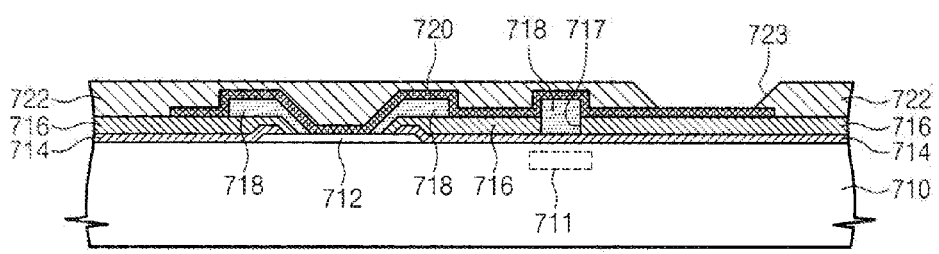

Referring to FIG. 8D, a third insulation layer pattern 722 may be formed on the second insulation layer pattern 718, the third insulation layer pattern 722 including land openings 723 respectively exposing portions of surfaces of the redistribution line patterns 720 which are spaced apart from the bonding pads 712 while covering the redistribution line patterns 720. The third insulation layer pattern 722 may be formed so that it covers upper portions of the redistribution line patterns 720 respectively. The third insulation layer pattern 722 may be formed so as to cover approximately half or less of the total area of the semiconductor chip 710. The third insulation layer pattern 722 may be made of an insulation layer of polymer-based material. The polymer-based material may be at least one selected from epoxy, polyimide, BCB, or PBO.

The semiconductor device including the redistribution line structure described above includes a second insulation layer pattern formed only on certain portions of the surface of the semiconductor device. For example, the second insulation layer pattern may be formed on a first insulation layer pattern close to bonding pads, on a fuse cutting opening, and on a bonding pad used in an EDS process. The semiconductor device also includes a third insulation layer pattern formed so as to cover only the redistribution line pattern. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

FIGS. 9A to 9D are cross-sectional views illustrating a method of forming a semiconductor device including a redistribution line structure of another exemplary embodiment of the present invention.

Figure 9A:
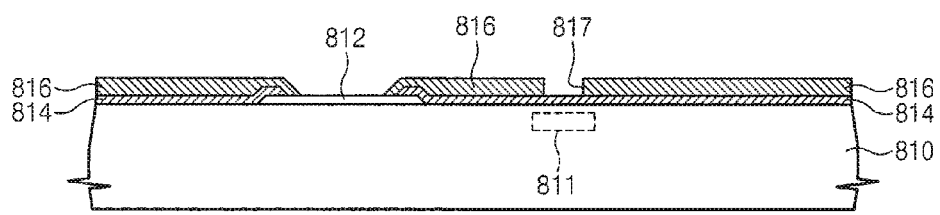
FIGS. 9A to 9D are cross-sectional views illustrating a method of fabricating a semiconductor device including a redistribution line structure according to another exemplary embodiment of the present invention.

Referring to FIG. 9A, a semiconductor chip 810 is provided, the semiconductor chip 810 including an active surface on which bonding pads 812 are disposed. The semiconductor chip 810 may include a repairing fuse 811 for use in case the semiconductor chip 810 is identified as defective in an Electrical Die Sorting (EDS) process.

A passivation layer pattern 814 may be formed, the passivation layer pattern 814 covering the active surface of the semiconductor chip 810 and exposing the bonding pads 812. A first insulation layer pattern 816 may be formed on the passivation layer pattern 814. The first insulation layer pattern 816 may include a fuse cutting opening 817 exposing the passivation layer pattern 814 over the fuse 811 included within the semiconductor chip 810.

Figure 9B:
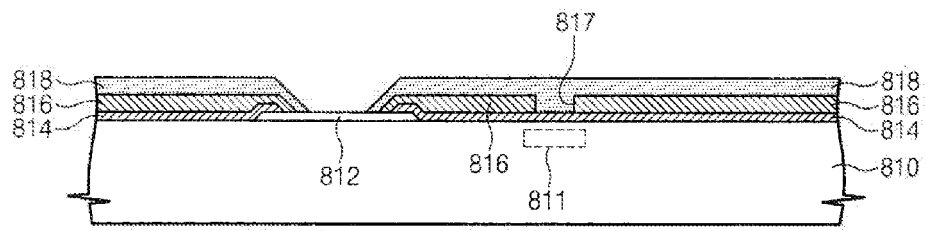

Referring to FIG. 9B, a second insulation layer pattern 818 is formed on the first insulation layer pattern 816. The second insulation layer pattern 818 is formed to fill the fuse cutting opening 817 and also to cover the first insulation layer pattern 816.

Figure 9C:
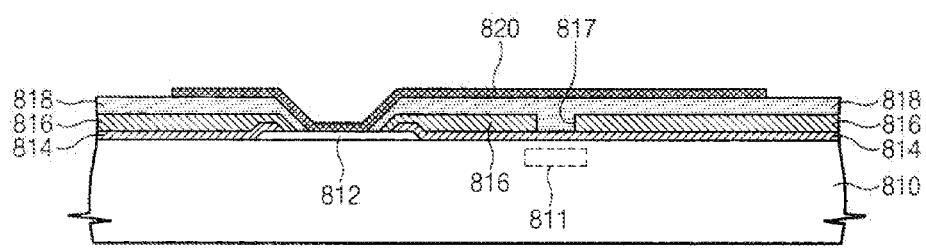

Referring to FIG. 9C, redistribution line patterns 820 may be formed, the redistribution line patterns 820 extending to the second insulation layer pattern 818, while being electrically connected to the bonding pads 812. An Under Barrier Metal (UBM) pattern (not shown) may be interposed on the exposed portions of the surfaces of the bonding pads 812 which overlap with the redistribution line patterns 820 and on the second insulation layer pattern 818. The UBM pattern may be used as an electrode in a plating process for forming the redistribution line patterns 820.

Figure 9D:
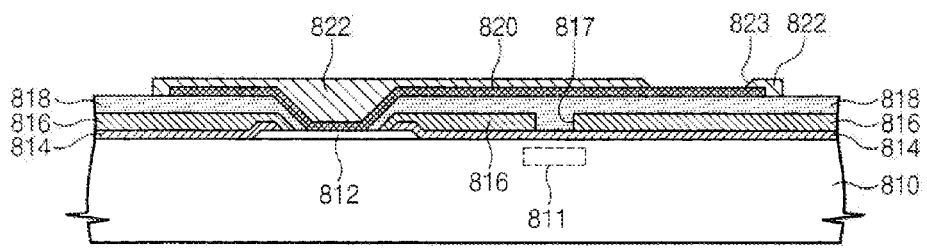

Referring to FIG. 9D, a third insulation layer pattern 822 may be formed on the second insulation pattern 818, the third insulation layer pattern 822 including land openings 823 respectively exposing portions of surfaces of the redistribution line patterns 820 which are spaced apart from the bonding pads 812 while covering the redistribution line patterns 820. The third insulation layer pattern 822 may be formed so that it only covers the redistribution line patterns 820. The third insulation layer pattern 822 may be formed so as to cover an area approximately half or less of a total area of the semiconductor chip 810.

The semiconductor device including a redistribution line structure described above has a third insulation layer pattern formed so as to only cover the redistribution line patterns. Therefore, the warpage of a wafer may be minimized. Consequently, it is not only easy to perform redistribution and subsequent processes, but also a stress inflicted on semiconductor chips by the warpage of the wafer is minimized so as to enhance the reliability of the semiconductor device.

Semiconductor devices including redistribution line structures of the present invention described above, may have a second and/or a third insulation layer pattern covering approximately half or less of a total area of a semiconductor chip. Therefore, the warpage of a wafer may be minimized. A semiconductor device and a method of forming the semiconductor device may be provided, the semiconductor device including a redistribution line structure which can make redistribution and subsequent processes easier and enhance the reliability of the semiconductor device.

In an exemplary embodiment of the present invention, a semiconductor device may include a semiconductor chip having an active surface on which pads are disposed; a passivation layer pattern covering the active surface of the semiconductor chip and exposing the pads; a first insulation layer pattern on the passivation layer pattern; a second insulation layer pattern disposed on at least a portion of the first insulation layer pattern; and redistribution line patterns electrically connected to the pads and extended on the second insulation layer pattern, wherein the second insulation layer pattern is disposed so as to cover approximately half or less of a total area of the semiconductor chip.

In another exemplary embodiment, the method of fabricating a semiconductor device may include providing a semiconductor chip including an active surface on which pads are disposed; forming a passivation layer pattern covering the active surface of the semiconductor chip and exposing the pads; forming a first insulation layer pattern on the passivation layer pattern; forming a second insulation layer pattern on the first insulation layer pattern; and forming redistribution line patterns electrically connected to the pads and extended on the second insulation layer pattern, wherein the second insulation layer pattern covers approximately half or less of a total area of the semiconductor chip.

The first and the second insulation layer patterns may comprise a polymer-based material. The polymer-based material may comprise at least one selected from epoxy, polyimide, benzocyclobutene, and polybenzoxazole. The second insulation layer pattern may be formed on the first insulation layer pattern close to lower portions of the redistribution line patterns. The second insulation layer pattern may be formed on portions of the first insulation layer pattern around the pads.

The semiconductor chip may include a fuse and the first insulation layer pattern may define a fuse cutting opening exposing the active surface of the semiconductor chip. The second insulation layer pattern may be formed so as to fill the fuse cutting opening and expose an upper surface of the first insulation layer pattern. The second insulation layer pattern may be formed so as to fill the fuse cutting opening and cover the first insulation layer pattern.

The method may further comprise forming a third insulation layer pattern on upper portions of the redistribution line patterns, the third insulation layer pattern defining a land opening exposing predetermined regions of the redistribution line patterns. The third insulation layer pattern may comprise a polymer-based material. The polymer-based material may comprise at least one selected from epoxy, polyimide, benzocyclobutene, and polybenzoxazole. The third insulation layer pattern may be formed so that it covers the upper portions of the redistribution line patterns respectively. The third insulation layer pattern may be formed so as to cover approximately half or less of the total area of the semiconductor chip.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor device comprising:
a semiconductor chip including an active surface on which pads are disposed;
a passivation layer pattern covering the active surface of the semiconductor chip and exposing the pads;
a first insulation layer pattern on the passivation layer pattern;
a fuse in the semiconductor chip, wherein the first insulation layer pattern defines a fuse cutting opening above the fuse exposing the passivation layer pattern;
a second insulation layer pattern on only a portion of the first insulation layer pattern, wherein the second insulation layer pattern fills the fuse cutting opening and exposes a portion of an upper surface of the first insulation layer pattern outside of the fuse cutting opening, and wherein the second insulation layer pattern includes a protruding portion at the fuse cutting opening; and
redistribution line patterns electrically connected to the pads and extending across the second insulation layer pattern and the first insulation layer pattern, wherein the redistribution line patterns are on sides of the protruding portion of the second insulation layer pattern.

2. The semiconductor device as claimed in claim 1, wherein the first and the second insulation layer patterns comprise a polymer-based material.

3. The semiconductor device as claimed in claim 2, wherein the polymer-based material comprises at least one selected from epoxy, polyimide, benzocyclobutene, and polybenzoxazole.

4. The semiconductor device as claimed in claim 1, wherein the second insulation layer pattern covers approximately half or less of a total area of the semiconductor chip.

5. The semiconductor device as claimed in claim 1, wherein the second insulation layer pattern is disposed on portions of the first insulation layer around the pads.

6. The semiconductor device as claimed in claim 1, wherein at least a portion of the second insulation layer pattern is disposed directly on the passivation layer pattern over the fuse in the semiconductor chip.

7. The semiconductor device as claimed in claim 1, further comprising a third insulation layer pattern disposed on upper portions of the redistribution line patterns, the third insulation layer pattern defining land openings exposing predetermined regions of the redistribution line patterns.

8. The semiconductor device as claimed in claim 7, wherein the third insulation layer pattern comprises a polymer-based material.

9. The semiconductor device as claimed in claim 8, wherein the polymer-based material comprises at least one selected from epoxy, polyimide, benzocyclobutene, and polybenzoxazole.

10. The semiconductor device as claimed in claim 7, wherein the third insulation layer pattern covers the upper portions of the redistribution line patterns, a portion of the second insulation layer pattern and a portion of the first insulation layer pattern.

11. The semiconductor device as claimed in claim 10, wherein the third insulation layer pattern covers approximately half or less of the total area of the semiconductor chip.

12. A semiconductor device comprising:
a semiconductor chip including an active surface on which pads are disposed;
a passivation layer pattern covering the active surface of the semiconductor chip and exposing the pads;
a first insulation layer pattern on the passivation layer pattern;
a second insulation layer pattern on at least a portion of the first insulation layer pattern, wherein the second insulation layer pattern includes a protruding portion;
redistribution line patterns electrically connected to the pads and extending across the second insulation layer pattern and the first insulation layer pattern, wherein the redistribution line patterns are on sides of the protruding portion of the second insulation layer pattern; and
a third insulation layer pattern on upper portions of the redistribution line patterns, the third insulation layer pattern defining land openings exposing predetermined regions of the redistribution line patterns,
wherein the third insulation layer pattern covers approximately half or less of a total area of the semiconductor chip.

13. The semiconductor device as claimed in claim 12, wherein the first and the second insulation layer patterns comprise a polymer-based material.

14. The semiconductor device as claimed in claim 13, wherein the polymer-based material comprises at least one selected from epoxy, polyimide, benzocyclobutene, and polybenzoxazole.

15. The semiconductor device as claimed in claim 12, wherein the second insulation layer pattern covers approximately half or less of the total area of the semiconductor chip.

16. The semiconductor device as claimed in claim 12, wherein the second insulation layer pattern is disposed on portions of the first insulation layer pattern around the pads.

17. The semiconductor device as claimed in claim 12, further comprising a fuse in the semiconductor chip, wherein the first insulation layer pattern defines a fuse cutting opening above the fuse exposing the active surface of the semiconductor chip.

18. The semiconductor device as claimed in claim 17, wherein the second insulation layer pattern fills the fuse cutting opening and exposes an upper surface of the first insulation layer pattern.

19. The semiconductor device as claimed in claim 12, wherein the third insulation layer pattern comprises a polymer-based material.

20. The semiconductor device as claimed in claim 19, wherein the polymer-based material comprises at least one selected from epoxy, polyimide, benzocyclobutene, and polybenzoxazole.

21. A semiconductor device comprising:
a semiconductor chip including an active surface on which pads are disposed;
a passivation layer pattern covering the active surface of the semiconductor chip and exposing the pads;
a first insulation layer pattern on the passivation layer pattern;
a second insulation layer pattern on a portion of the first insulation layer pattern overlapping the pads, the second insulation layer pattern exposing portions of the first insulation layer pattern that do not overlap the pads, wherein the second insulation layer pattern includes a protruding portion; and
redistribution line patterns electrically connected to the pads and extending across the second insulation layer pattern and the first insulation layer pattern, wherein the redistribution line patterns are on sides of the protruding portion of the second insulation layer pattern.

22. The semiconductor device of claim 1, wherein the second insulation layer pattern is on portions of the first insulation layer pattern around the pads and is absent from a majority of the first insulation layer pattern.

* * * * *